(12) United States Patent
Drago et al.

(10) Patent No.: US 11,428,825 B2
(45) Date of Patent: Aug. 30, 2022

(54) METHODS AND SYSTEMS FOR UNIFORM CT DETECTOR HEAT DISTRIBUTION

(71) Applicant: GE Precision Healthcare LLC, Milwaukee, WI (US)

(72) Inventors: Jahir Drago, Sussex, WI (US); Nicholas Konkle, Waukesha, WI (US); Grant Schueneman, Waukesha, WI (US); Faisal Saeed, Hartland, WI (US); James Rose, Guilderland, NY (US)

(73) Assignee: GE Precision Healthcare LLC, Milwaukee, WI (US)

(*) Notice: Subject to any disclaimer, the term of this patent is extended or adjusted under 35 U.S.C. 154(b) by 438 days.

(21) Appl. No.: 16/721,457

(22) Filed: Dec. 19, 2019

(65) Prior Publication Data
US 2021/0190978 A1   Jun. 24, 2021

(51) Int. Cl.
*G01T 1/24* (2006.01)
*H05K 1/18* (2006.01)
*H05K 1/02* (2006.01)
*G01N 23/046* (2018.01)

(52) U.S. Cl.
CPC ............ *G01T 1/244* (2013.01); *H05K 1/0203* (2013.01); *H05K 1/181* (2013.01); *G01N 23/046* (2013.01); *H05K 2201/066* (2013.01); *H05K 2201/10121* (2013.01); *H05K 2201/10151* (2013.01); *H05K 2201/10356* (2013.01); *H05K 2201/10545* (2013.01)

(58) Field of Classification Search
CPC ...................................... G01T 1/244
USPC ..................................... 250/370.09
See application file for complete search history.

(56) References Cited

U.S. PATENT DOCUMENTS

2020/0064498 A1* 2/2020 Nakai ................ G01T 1/24

* cited by examiner

*Primary Examiner* — Joel W Fosselman
(74) *Attorney, Agent, or Firm* — McCoy Russell LLP

(57) ABSTRACT

Various methods and systems are provided for an imaging detector array. In one example, a detector module of the array has a central slit separating a first tile from a second tile of the detector module. An integrated circuit is located along a first side of the first tile and along a first side of the second tile and flex cable coupled to the integrated circuit of the first portion extends through the central slit of the detector module.

20 Claims, 8 Drawing Sheets

METHODS AND SYSTEMS FOR UNIFORM CT DETECTOR HEAT DISTRIBUTION

FIELD

Embodiments of the subject matter disclosed herein relate to non-invasive diagnostic imaging and non-destructive testing, and more particularly to computed tomography (CT) detectors and methods for uniform heat distribution across CT detectors.

BACKGROUND

Non-invasive imaging technologies allow images of the internal structures of a patient or an object to be obtained without performing an invasive procedure on the patient or object. In particular, technologies such as computed tomography (CT) use various physical principles, such as the differential transmission of x-rays through the target volume, to acquire image data and to construct tomographic images (e.g., three-dimensional representations of the interior of the human body or of other imaged structures).

Non-attenuated x-rays passing through the target volume may be collected by a CT detector. The CT detector may include an array of detector modules configured to emit light upon interaction with the x-rays. The emitted light may be converted into electrical signals and used to generate the tomographic images. The detector modules may each be an individual electrical circuit coupled to a common computing device. Digital reconstruction may occur at the computing device, based on the signals received from the array of detector modules.

BRIEF DESCRIPTION

In one embodiment, an imaging system comprises at least one detector module, the at least one detector module having a central slit separating a first tile from a second tile of the at least one detector module, a first integrated circuit located along a first side of the first tile, the first side of the first tile facing the central slit and proximate to the second tile, and a second integrated circuit located along a first side of the second tile, the first side of the second portion an outward-facing surface of the at least one module and distal to the first portion, and a first cable coupled to the first integrated circuit of the first tile and extending through the central slit of the at least one detector module. In this way, heat is dispersed more uniformly across a detector array formed of one or more of the detector module.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 3-10 are shown approximately to scale, however, other relative dimensions may be used, if desired.

DETAILED DESCRIPTION

Figure 3:
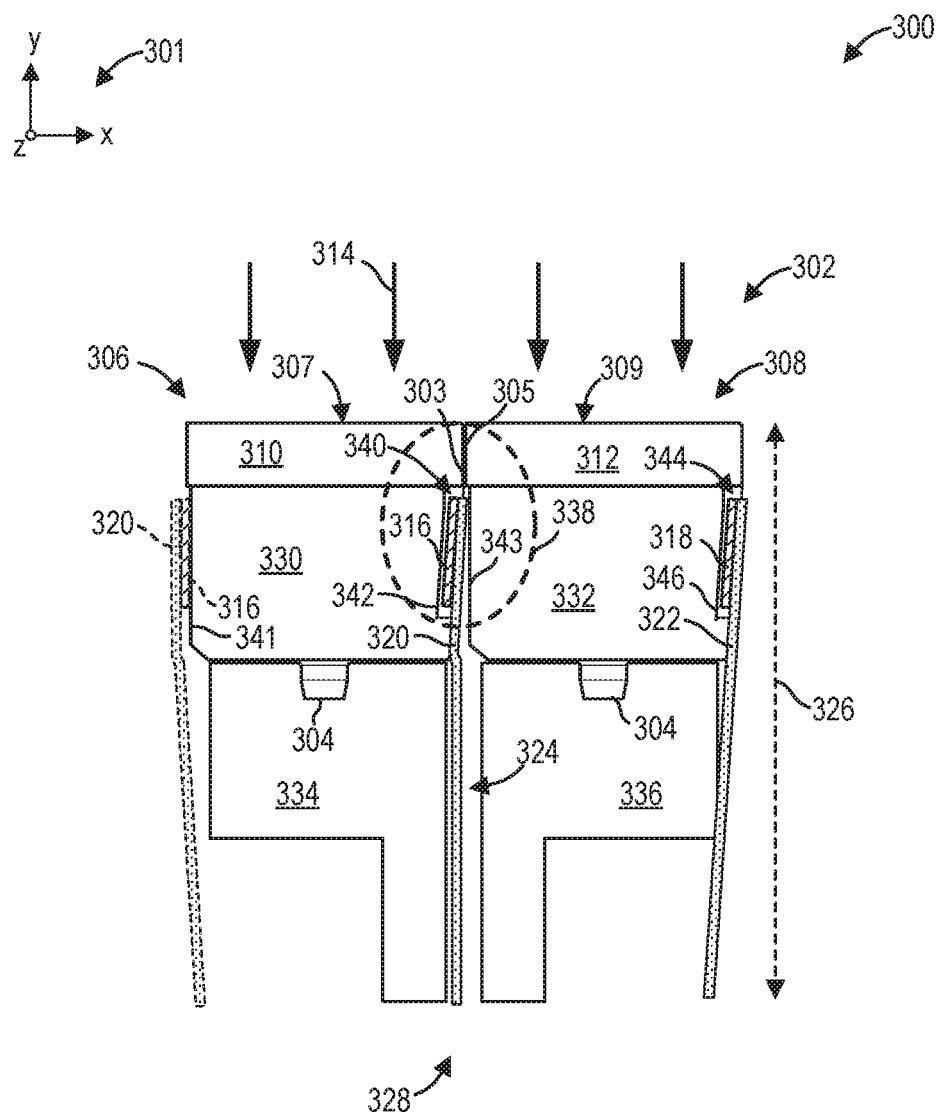
FIG. 3 shows a first example of a detector module which may be included in the imaging system of FIG. 1, according to an embodiment.
Figure 4:
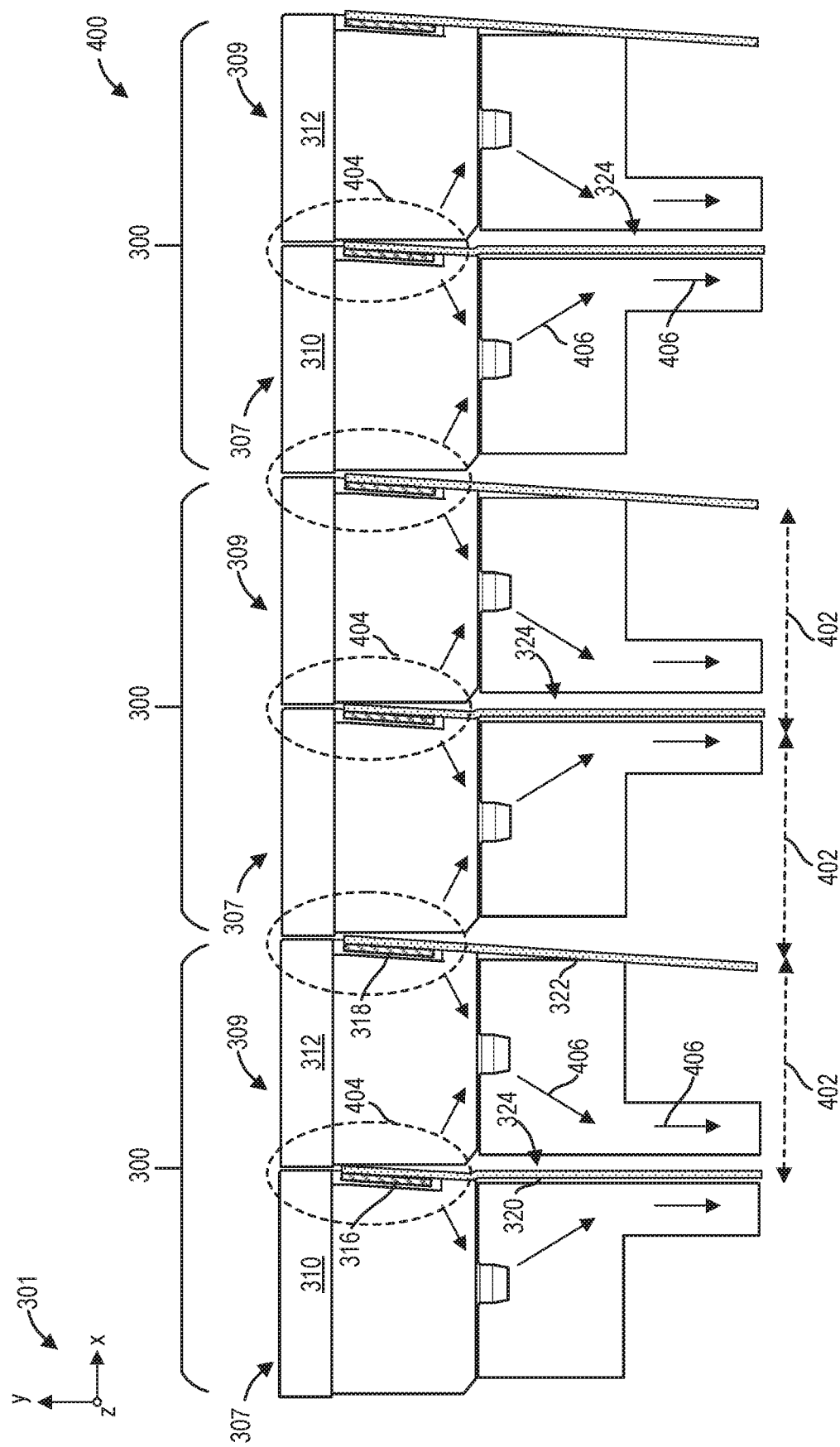
FIG. 4 shows a detector array formed from more than one of the detector module of FIG. 3.
Figure 5:
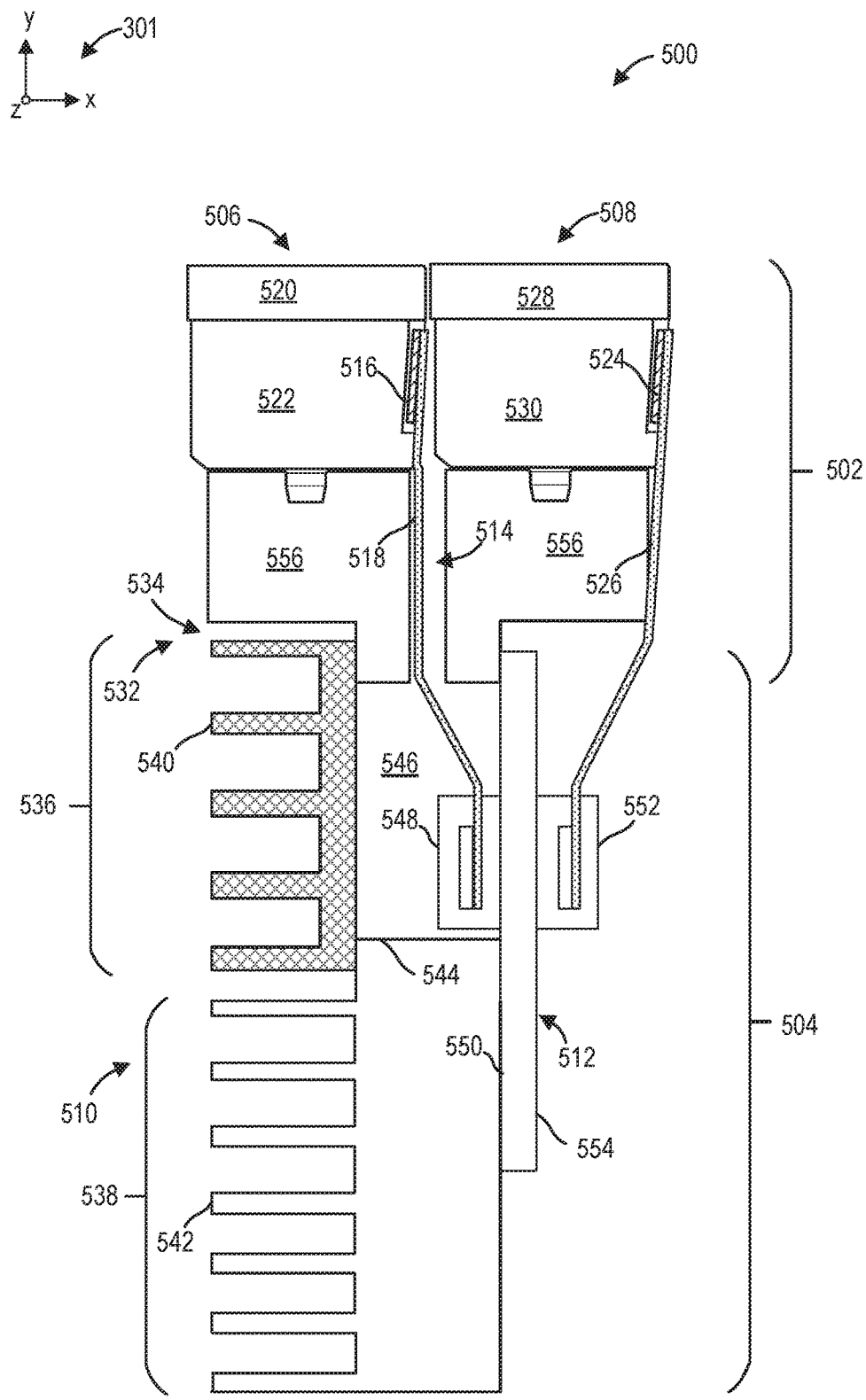
FIG. 5 shows a second example of a detector module configured with a removable cover, according to an embodiment.
Figure 6:
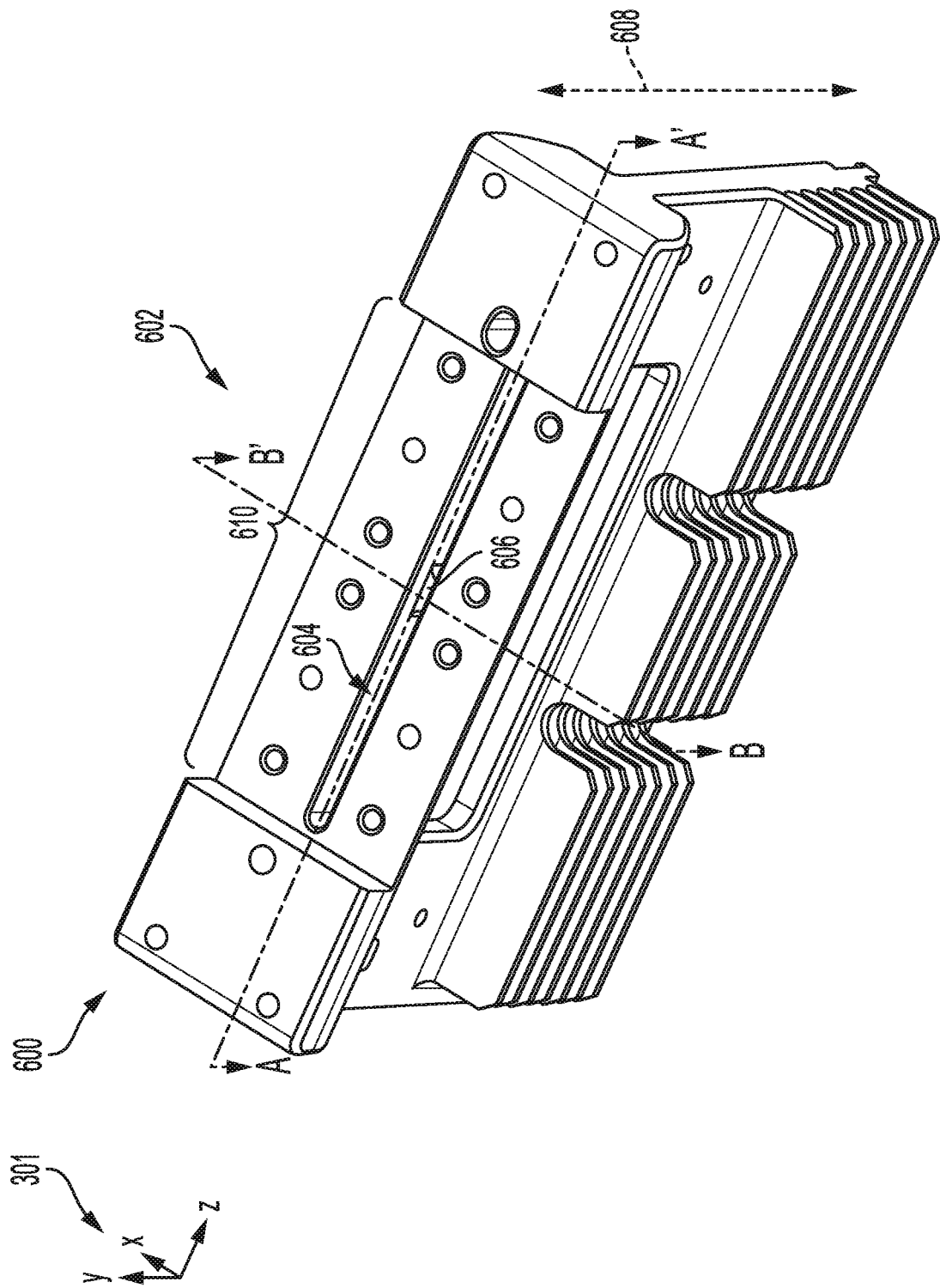
FIG. 6 shows a base block for a detector module, according to an embodiment.
Figure 7:
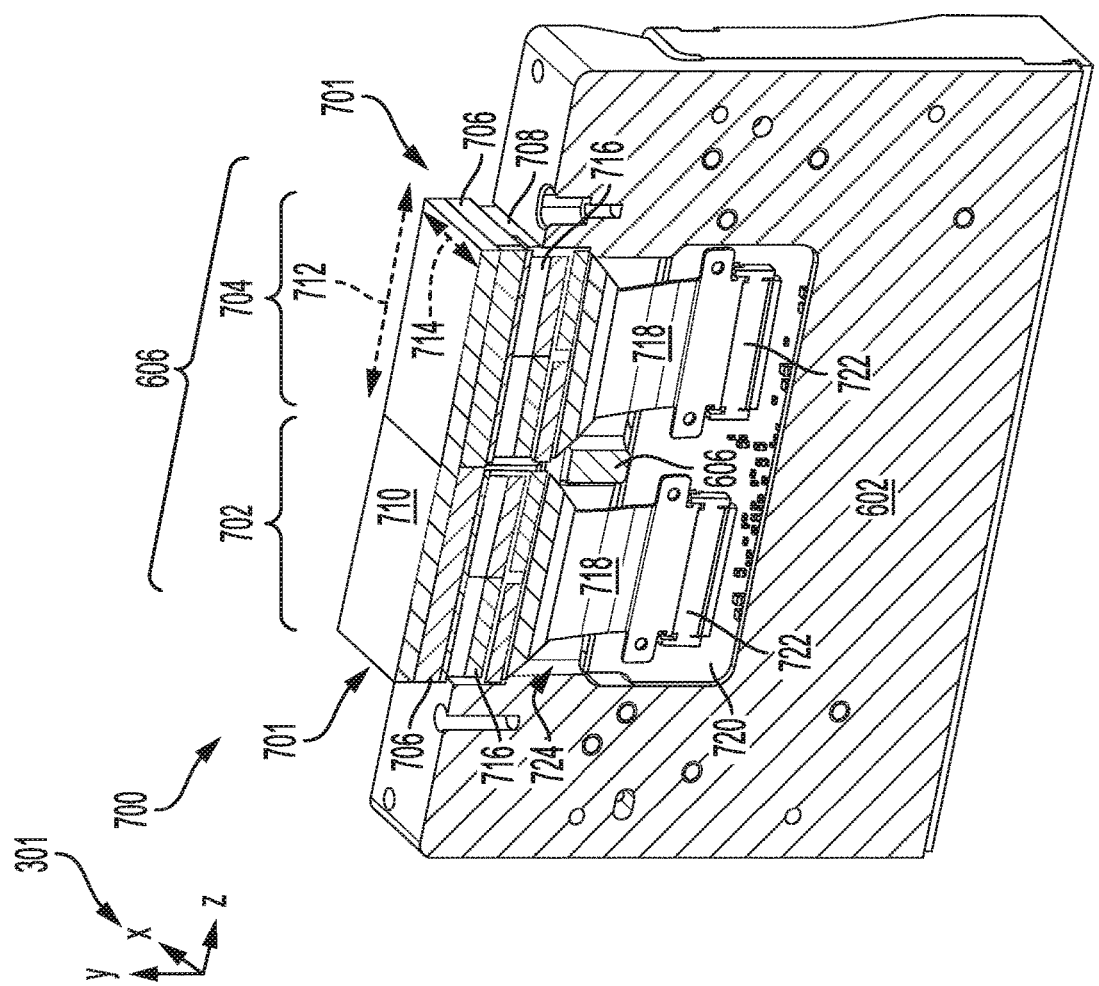
FIG. 7 shows a first view of the base block of FIG. 6 implemented in a detector module.
Figure 8:
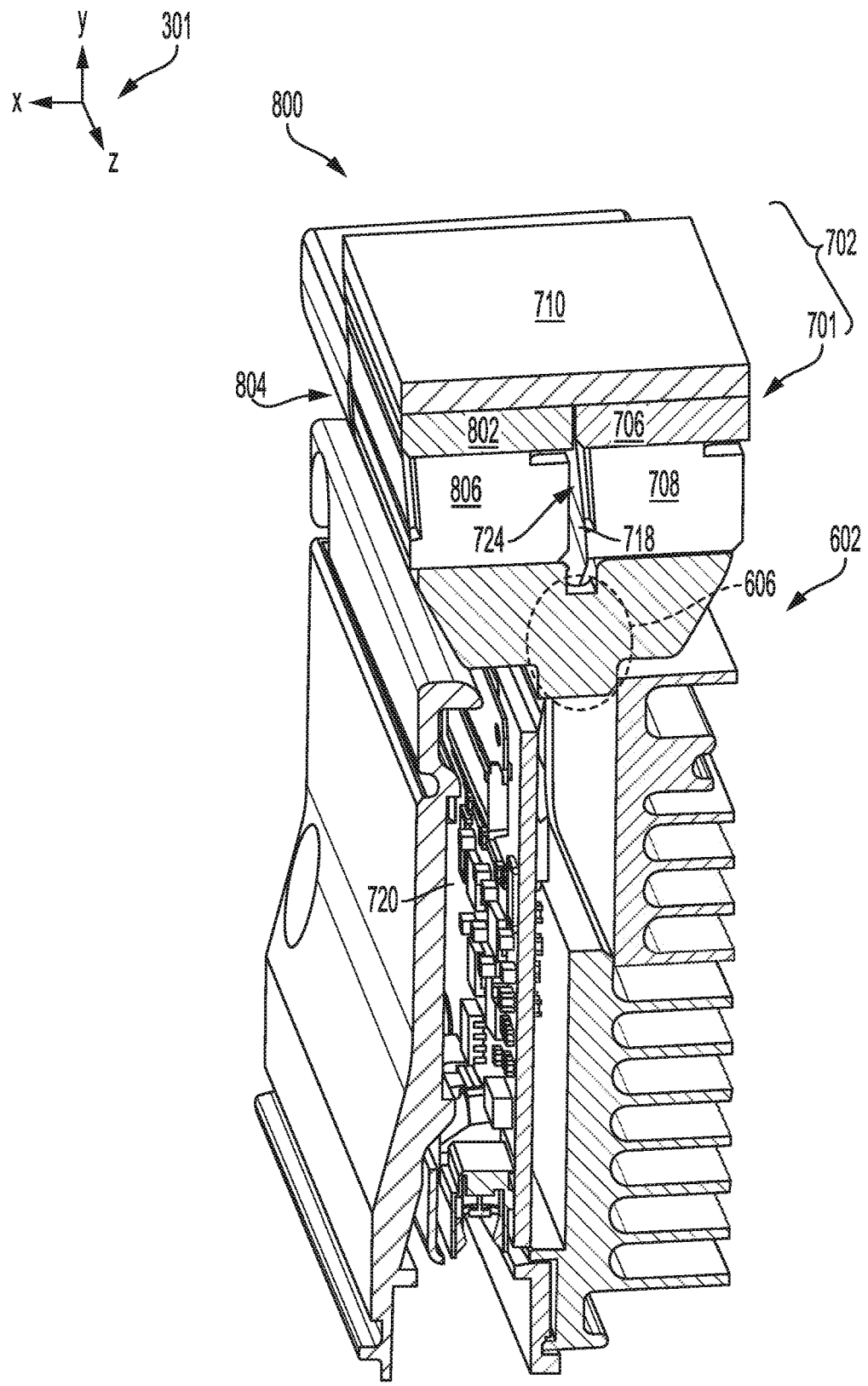
FIG. 8 shows a second view of the base block of FIG. 6 implemented in the detector module.
Figure 10:
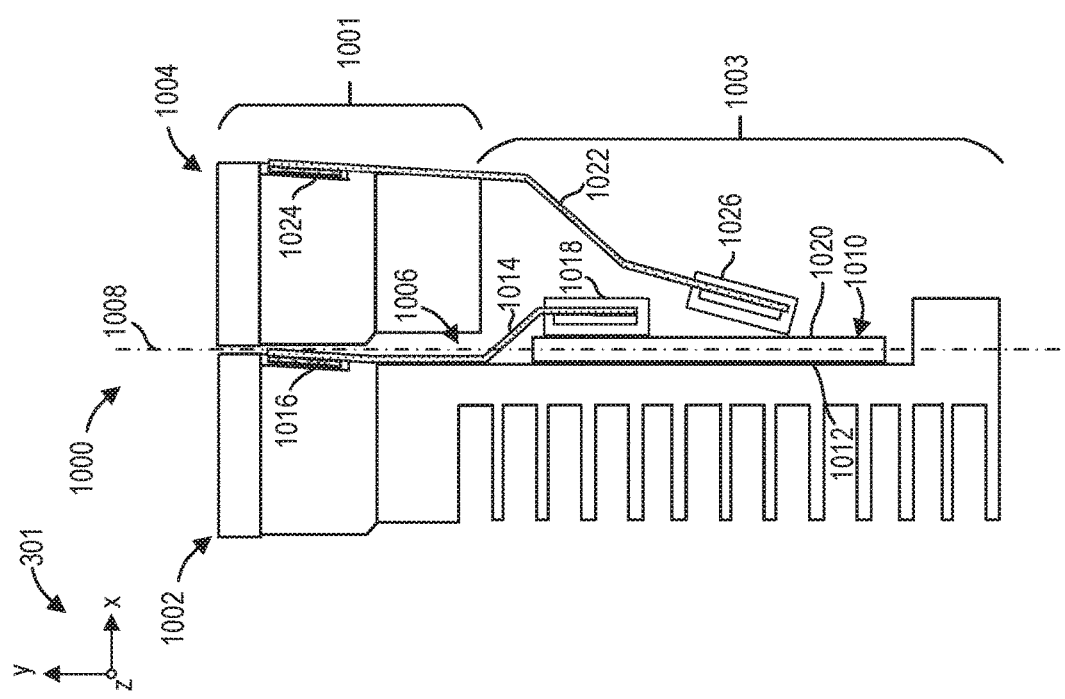
FIG. 10 shows a fourth example of a detector module adapted to enable coupling of flex cables to a single side of a circuit board, according to an embodiment.
Figure 9:
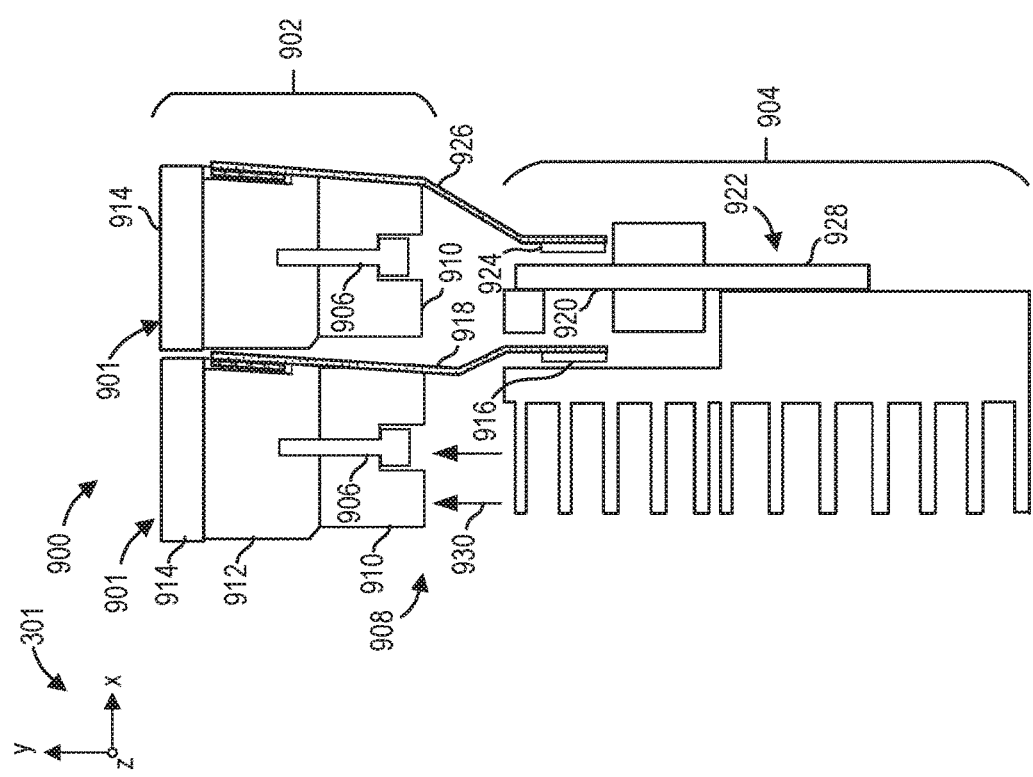
FIG. 9 shows a third example of a detector module formed of two detachable portions, according to an embodiment.

The following description relates to various embodiments of a CT detector. The CT detector may be included in an imaging system, such as an imaging system illustrated in a pictorial view and as a schematic diagram in FIGS. 1 and 2. The CT detector may include an array of detector modules, each detector module forming an electronic circuit. In some examples, an upper portion of the detector module may include a slit dividing the upper portion into two sets of chiclets or tiles, each tile having a direct conversion detector, such as a photodiode, stacked above each tile. Each set of tiles may include one or more tiles. A first example of a detector module adapted with a slit is shown in FIG. 3. More than one of the detector module may be included in a detector array, as shown in FIG. 4, where the presence of the slit in each detector module allows an application-specific integrated circuit (ASIC) to be coupled to a same side of each detector module. As a result, the ASICs may be evenly spaced apart, or evenly distributed, through the detector array, enabling uniform distribution of heat through the array and reducing exposure of detector photodiodes to elevated temperatures. In one example, the detector module may be further adapted to have a removable cover, as shown in FIG. 5, that is also a heat sink which may further assist in drawing heat away from the photodiodes. As another optional aspect, a base block of the detector module may be configured with a thermal bridge that allows equalization of thermal gradients between tiles of the detector module. An example of a base block is shown in FIG. 6 and incorporation of the base block into a detector module is depicted in FIGS. 7 and 8. In FIG. 9, another example of the detector module is illustrated where the detector module has a two-piece structure. The two-piece structure is configured to be detachable to enable access to inner fasteners of the detector module as well as access to opposite sides of a single circuit board. In other examples, as shown in FIG. 10, the circuit board may be configured to couple to electrical connectors along a single side of the circuit board, thereby allowing a manufacturing of the detector module to be more convenient and efficient.

CT imaging may be used to obtain 3-dimensional (3D) x-ray images where the images may be generated by combining x-ray measurements taken from different angles. The x-ray measurements produce cross-sectional images of a target imaging region which may be digitally stacked to form the 3D image. Images produced by CT imaging may provide more detailed information than conventional, two-dimensional x-ray imaging.

A CT scanner may include a motorized x-ray source configured to rotate around a patient, emitting x-ray beams from an x-ray source that pass through the patient. X-ray beams that are not attenuated by the patient are received at a detector positioned opposite of the x-ray source. The detector may be formed of an array of detector modules, each module including a plurality of photodiodes configured to convert light to electrical signals. One or more application specific integrated circuits (ASICs) may be coupled to each detector module, the ASICs enabling transmission of the electrical signals to a circuit board via a flex cable. The ASICs may be attached to flex cables which provide electrical coupling of the photodiodes to a circuit board. The flex cables are much thinner and more flexible than conventional cables, thereby occupying less space and allowing streamlined coupling of the flex cables to the photodiodes, e.g., without bulky electrical connectors, as well as placement of the ASICs along a side of the detector module frame, below the photodiodes. As a result, gaps between the photodiodes may be minimized.

The ASICs may generate heat during operation of the CT scanner, leading to heating of the detector modules. The ASICs may be coupled to outer surfaces of each detector module, leading to localized heating at an outer periphery of the detector modules. An inner region of each module may experience little heating, due to positioning of the ASICS. The localized heating may lead to formation of hot zones and cold zones throughout the detector array and such uneven heat distribution may cause high variability in the CT scanner performance.

The inventors herein have recognized such issues. In one example, the issues described above may be at least partially addressed by routing the flex cable through a slit disposed in a central region of the module. At least a portion of the ASICs of the detector array may be positioned at an inner regions of the detector modules, allowing for more uniform spacing of the ASICS across the detector array. Similarly, at least a portion, of the flex cables of a detector array may be coupled to the ASICs positioned at the inner regions so that the flex cables extend along the inner regions of the detector modules. As a result, a temperature of the detector modules may be more uniform across the detector array, enabling more consistent and reliable CT imaging results, and lengths of the flex cables may be reduced. Details of the positioning of the ASICS and flex cables are further elaborated below with reference to FIGS. 3-10, following an overview of a CT imaging system depicted in FIGS. 1 and 2.

Figure 1:
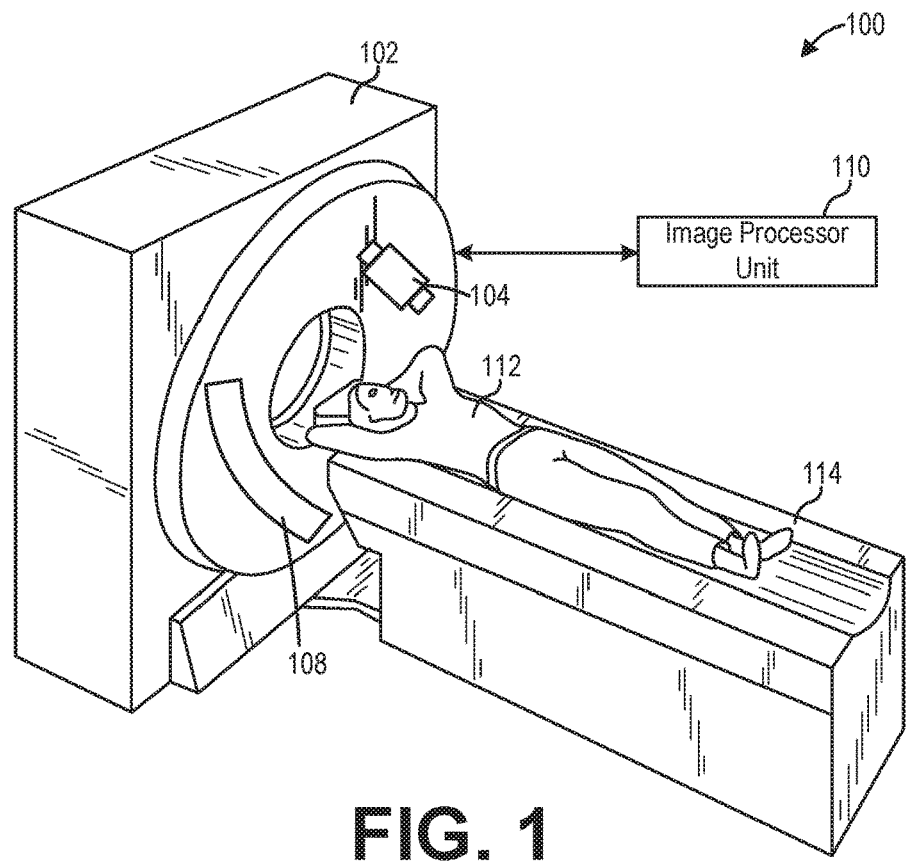
FIG. 1 shows a pictorial view of an imaging system, according to an embodiment.

FIG. 1 illustrates an exemplary CT imaging system 100 configured for CT imaging. Particularly, the CT imaging system 100 is configured to image a subject 112 such as a patient, an inanimate object, one or more manufactured parts, industrial components, and/or foreign objects such as implants, stents, and/or contrast agents present within the body. In one embodiment, the CT imaging system 100 includes a gantry 102, which in turn, may further include at least one x-ray source 104 configured to project a beam of x-ray radiation 106 (see FIG. 2) for use in imaging the subject 112 laying on a table 114. Specifically, the x-ray source 104 is configured to project the x-ray radiation beam 106 towards a detector array 108 positioned on the opposite side of the gantry 102. Although FIG. 1 depicts only a single x-ray source 104, in certain embodiments, multiple x-ray sources may be employed to project a plurality of x-ray radiation beams towards multiple detectors for acquiring projection data at different energy levels corresponding to the patient. In some embodiments, the x-ray source 104 may enable dual-energy gemstone spectral imaging (GSI) by rapid peak kilovoltage (kVp) switching. In some embodiments, the x-ray detector employed is a photon-counting detector which is capable of differentiating x-ray photons of different energies. In other embodiments, two sets of x-ray sources and x-ray detectors are used to generate dual-energy projections, with one set at low-kVp and the other at high-kVp. It should thus be appreciated that the methods described herein may be implemented with single energy acquisition techniques as well as dual energy acquisition techniques.

In certain embodiments, the CT imaging system 100 further includes an image processor unit 110 configured to reconstruct images of a target volume of the subject 112 using an iterative or analytic image reconstruction method. For example, the image processor unit 110 may use an analytic image reconstruction approach such as filtered back projection (FBP) to reconstruct images of a target volume of the patient. As another example, the image processor unit 110 may use an iterative image reconstruction approach such as advanced statistical iterative reconstruction (ASIR), conjugate gradient (CG), maximum likelihood expectation maximization (MLEM), model-based iterative reconstruction (MBIR), and so on to reconstruct images of a target volume of the subject 112. As described further herein, in some examples the image processor unit 110 may use both an analytic image reconstruction approach such as FBP in addition to an iterative image reconstruction approach.

In some CT imaging system configurations, an x-ray radiation source projects a cone-shaped beam which is collimated to lie within an X-Y-Z plane of a Cartesian coordinate system and generally referred to as an "imaging plane." The x-ray radiation beam passes through an object being imaged, such as the patient or subject. The x-ray radiation beam, after being attenuated by the object, impinges upon an array of x-ray detector elements. The intensity of the attenuated x-ray radiation beam received at the detector array is dependent upon the attenuation of an x-ray radiation beam by the object. Each x-ray detector element of the detector array produces a separate electrical signal that is a measurement of the x-ray radiation beam attenuation at the detector location. The attenuation measurements from all the x-ray detector elements are acquired separately to produce a transmission profile.

In some CT imaging systems, the x-ray source and the detector array are rotated with a gantry within the imaging plane and around the object to be imaged such that an angle at which the x-ray radiation beam intersects the object constantly changes. A group of x-ray radiation attenuation measurements, e.g., projection data, from the detector array at one gantry angle is referred to as a "view." A "scan" of the object includes a set of views made at different gantry angles, or view angles, during one revolution of the x-ray source and detector. It is contemplated that the benefits of the methods described herein accrue to medical imaging modalities other than CT, so as used herein the term "view" is not limited to the use as described above with respect to projection data from one gantry angle. The term "view" is used to mean one data acquisition whenever there are multiple data acquisitions from different angles, whether from a CT, positron emission tomography (PET), or single-photon emission CT (SPECT) acquisition, and/or any other modality including modalities yet to be developed as well as combinations thereof in fused embodiments.

The projection data is processed to reconstruct an image that corresponds to a two-dimensional slice taken through the object or, in some examples where the projection data includes multiple views or scans, a three-dimensional rendering of the object. One method for reconstructing an image from a set of projection data is referred to in the art as the filtered back projection technique. Transmission and emission tomography reconstruction techniques also include statistical iterative methods such as maximum likelihood expectation maximization (MLEM) and ordered-subsets expectation-reconstruction techniques as well as iterative reconstruction techniques. This process converts the attenuation measurements from a scan into integers called "CT numbers" or "Hounsfield units," which are used to control the brightness of a corresponding pixel on a display device.

To reduce the total scan time, a "helical" scan may be performed. To perform a "helical" scan, the patient is moved while the data for the prescribed number of slices is acquired. Such a system generates a single helix from a cone beam helical scan. The helix mapped out by the cone beam yields projection data from which images in each prescribed slice may be reconstructed.

As used herein, the phrase "reconstructing an image" is not intended to exclude embodiments of the present invention in which data representing an image is generated but a viewable image is not. Therefore, as used herein, the term "image" broadly refers to both viewable images and data representing a viewable image. However, many embodiments generate (or are configured to generate) at least one viewable image.

Figure 2:
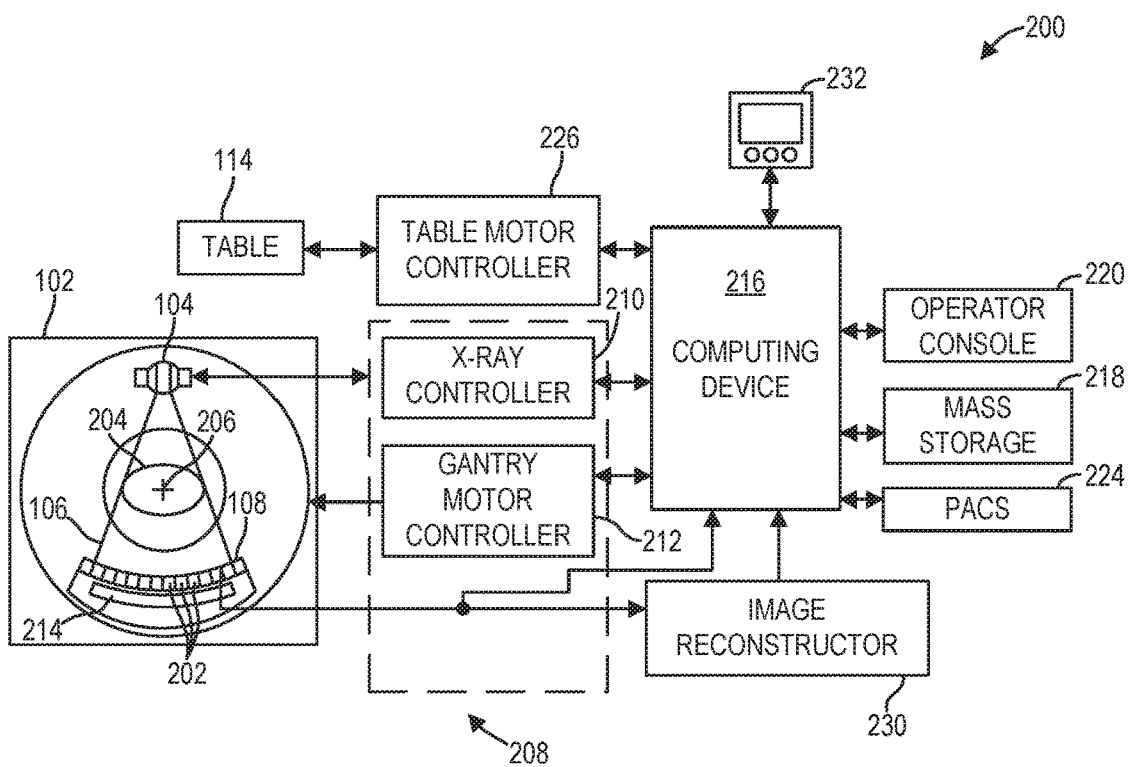
FIG. 2 shows a block schematic diagram of an exemplary imaging system, according to an embodiment.

FIG. 2 illustrates an exemplary imaging system 200 similar to the CT system 100 of FIG. 1. In accordance with aspects of the present disclosure, the imaging system 200 is configured for imaging a subject 204 (e.g., the subject 112 of FIG. 1). In one embodiment, the imaging system 200 includes the detector array 108 (see FIG. 1). The detector array 108 further includes a plurality of x-ray detector elements 202 that together sense the x-ray radiation beams 106 that pass through the subject 204 (such as a patient) to acquire corresponding projection data. Accordingly, in one embodiment, the detector array 108 is fabricated in a multi-slice configuration including the plurality of rows of cells or x-ray detector elements 202. In such a configuration, one or more additional rows of the x-ray detector elements 202 are arranged in a parallel configuration for acquiring the projection data.

In certain embodiments, the imaging system 200, such as a CT imaging system or an x-ray imaging system, is configured to traverse different angular positions around the subject 204 for acquiring desired projection data. Accordingly, the gantry 102 and the components mounted thereon may be configured to rotate about a center of rotation 206 for acquiring the projection data, for example, at different energy levels. Alternatively, in embodiments where a projection angle relative to the subject 204 varies as a function of time, the mounted components may be configured to move along a general curve rather than along a segment of a circle.

As the x-ray source 104 and the detector array 108 rotate, the detector array 108 collects data of the attenuated x-ray beams. The data collected by the detector array 108 undergoes pre-processing and calibration to condition the data to represent the line integrals of the attenuation coefficients of the scanned subject 204. The processed data are commonly called projections.

In some examples, the individual detectors or x-ray detector elements 202 of the detector array 108 may include photon-counting detectors which register the interactions of individual photons into one or more energy bins. It should be appreciated that the methods described herein may also be implemented with energy-integrating detectors.

The acquired sets of projection data may be used for basis material decomposition (BMD). During BMD, the measured projections are converted to a set of material-density projections. The material-density projections may be reconstructed to form a pair or a set of material-density map or image of each respective basis material, such as bone, soft tissue, and/or contrast agent maps. The density maps or images may be, in turn, associated to form a volume rendering of the basis material, for example, bone, soft tissue, and/or contrast agent, in the imaged volume.

Once reconstructed, the basis material image produced by the imaging system 200 reveals internal features of the subject 204, expressed in the densities of two basis materials. The density image may be displayed to show these features. In traditional approaches to diagnosis of medical conditions, such as disease states, and more generally of medical events, a radiologist or physician would consider a hard copy or display of the density image to discern characteristic features of interest. Such features might include lesions, sizes and shapes of particular anatomies or organs, and other features that would be discernable in the image based upon the skill and knowledge of the individual practitioner.

In one embodiment, the imaging system 200 includes a control mechanism 208 to control movement of the components such as rotation of the gantry 102 and the operation of the x-ray source 104. In certain embodiments, the control mechanism 208 further includes an x-ray controller 210 configured to provide power and timing signals to the x-ray source 104. Additionally, the control mechanism 208 includes a gantry motor controller 212 configured to control a rotational speed and/or position of the gantry 102 based on imaging requirements.

In certain embodiments, the control mechanism 208 further includes a data acquisition system (DAS) 214 configured to sample analog data received from the detector elements 202 and convert the analog data to digital signals for subsequent processing. The DAS 214 may be further configured to selectively aggregate analog data from a subset of the detector elements 202 into so-called macro-detectors, as described further herein. The data sampled and digitized by the DAS 214 is transmitted to a computer or computing device 216. In one example, the computing device 216 stores the data in a storage device or mass storage 218. The storage device 218, for example, may include a hard disk drive, a floppy disk drive, a compact disk-read/write (CD-R/W) drive, a Digital Versatile Disc (DVD) drive, a flash drive, and/or a solid-state storage drive.

Additionally, the computing device 216 provides commands and parameters to one or more of the DAS 214, the x-ray controller 210, and the gantry motor controller 212 for controlling system operations such as data acquisition and/or processing. In certain embodiments, the computing device 216 controls system operations based on operator input. The computing device 216 receives the operator input, for example, including commands and/or scanning parameters via an operator console 220 operatively coupled to the computing device 216. The operator console 220 may include a keyboard (not shown) or a touchscreen to allow the operator to specify the commands and/or scanning parameters.

Although FIG. 2 illustrates only one operator console 220, more than one operator console may be coupled to the imaging system 200, for example, for inputting or outputting system parameters, requesting examinations, plotting data, and/or viewing images. Further, in certain embodiments, the imaging system 200 may be coupled to multiple displays, printers, workstations, and/or similar devices located either locally or remotely, for example, within an institution or hospital, or in an entirely different location via one or more configurable wired and/or wireless networks such as the Internet and/or virtual private networks, wireless telephone networks, wireless local area networks, wired local area networks, wireless wide area networks, wired wide area networks, etc.

In one embodiment, for example, the imaging system 200 either includes, or is coupled to, a picture archiving and communications system (PACS) 224. In an exemplary implementation, the PACS 224 is further coupled to a remote system such as a radiology department information system, hospital information system, and/or to an internal or external network (not shown) to allow operators at different locations to supply commands and parameters and/or gain access to the image data.

The computing device 216 uses the operator-supplied and/or system-defined commands and parameters to operate a table motor controller 226, which in turn, may control a table 114 which may be a motorized table. Specifically, the table motor controller 226 may move the table 114 for appropriately positioning the subject 204 in the gantry 102 for acquiring projection data corresponding to the target volume of the subject 204.

As previously noted, the DAS 214 samples and digitizes the projection data acquired by the detector elements 202. Subsequently, an image reconstructor 230 uses the sampled and digitized x-ray data to perform high-speed reconstruction. Although FIG. 2 illustrates the image reconstructor 230 as a separate entity, in certain embodiments, the image reconstructor 230 may form part of the computing device 216. Alternatively, the image reconstructor 230 may be absent from the imaging system 200 and instead the computing device 216 may perform one or more functions of the image reconstructor 230. Moreover, the image reconstructor 230 may be located locally or remotely, and may be operatively connected to the imaging system 200 using a wired or wireless network. Particularly, one exemplary embodiment may use computing resources in a "cloud" network cluster for the image reconstructor 230.

In one embodiment, the image reconstructor 230 stores the images reconstructed in the storage device 218. Alternatively, the image reconstructor 230 may transmit the reconstructed images to the computing device 216 for generating useful patient information for diagnosis and evaluation. In certain embodiments, the computing device 216 may transmit the reconstructed images and/or the patient information to a display or display device 232 communicatively coupled to the computing device 216 and/or the image reconstructor 230. In some embodiments, the reconstructed images may be transmitted from the computing device 216 or the image reconstructor 230 to the storage device 218 for short-term or long-term storage.

The various methods and processes described further herein may be stored as executable instructions in non-transitory memory on a computing device (or controller) in imaging system 200. In one embodiment, image reconstructor 230 may include such executable instructions in non-transitory memory, and may apply the methods described herein to reconstruct an image from scanning data. In another embodiment, computing device 216 may include the instructions in non-transitory memory, and may apply the methods described herein, at least in part, to a reconstructed image after receiving the reconstructed image from image reconstructor 230. In yet another embodiment, the methods and processes described herein may be distributed across image reconstructor 230 and computing device 216.

In one embodiment, the display 232 allows the operator to evaluate the imaged anatomy. The display 232 may also allow the operator to select a volume of interest (VOI) and/or request patient information, for example, via a graphical user interface (GUI) for a subsequent scan or processing.

It will be appreciated that while an exemplary CT imaging system is shown in FIGS. 1 and 2, details of a detector module described herein may be applicable to other systems beyond the CT imaging system. For example, the detector module may be used in PET CT systems, ultrasound systems, and mobile x-ray imaging systems.

As described above, a detector array may include a plurality of detector elements (e.g., detector elements 202 of FIG. 2). The detector array may be implemented in a variety of imaging systems, such as the CT imaging system shown in FIGS. 1 and 2, in stationary x-ray imaging systems, in ultrasound systems, etc. Each of the plurality of detector elements may be incorporated into a detector module formed of a number of components such as one or more direct conversion detectors, one or more ASICs, a circuit board, electrical connectors, a heat sink, etc. When used in the CT imaging system, the direct conversion detectors may be photodiodes. Heat may be generated at the ASICs during transmission of electrical signals from the photodiodes to the circuit board. Formation of hot regions and cold regions across the detector module may result, the hot regions localized at the ASICs and the cold regions occurring between the ASICs.

Heat may be distributed more evenly across the detector module by spacing the ASICs evenly apart. Even spacing of the ASICs may be enabled by adapting the detector module with a centrally located slit providing clearance for one of the ASICS as well as a flex cable coupled to the ASICs. Configuring the detector module with the slot allows the ASIC to be positioned along an inner region of the detector module, circumventing uneven heating arising from a conventional arrangement of the ASICs along outer surfaces of the detector module. An example of a detector module equipped with a central slit is depicted in FIG. 3.

An upper portion 302 of a first example of a detector module 300 is shown in FIG. 3. A set of reference axes 301 are provided, indicating a y-axis, an x-axis and a z-axis. The upper portion 302 may be coupled to a lower portion, as shown in FIGS. 5 and 7-10, of the detector module 300. The upper portion 302 includes a first chiclet or tile 306 and a second tile 308, each tile formed of similar components. In some examples, the first tile 306 and the second tile 308 may be identical. Furthermore, in some examples, the first tile 306 may be one tile in a first set of tiles aligned along the z-axis on a same side of a centrally located slit 324. Similarly, the second tile 308 may be one tile in a second set of tiles also aligned along the z-axis on a same side of the slit 324, opposite of the first set of tiles. Each set of tiles may include one or more tiles. As one example, the detector module 300 may include two tiles in each set of tiles, forming a two-by-two array of tiles.

The first tile 306 of the detector module 300 has a first photodiode 310 and the second tile 308 has a second photodiode 312. The first photodiode 310 and the second photodiode 312 may be aligned along the x-axis and may form a layer at an upper region of the detector module 300, with respect to the y-axis. While the first photodiode 310 and the second photodiode 312 are shown spaced away from one another by a small gap, the first and second photodiodes 310, 312 may be arranged flush, e.g., in face-sharing contact so that a right edge 303 of the first photodiode 310 is in contact with a left edge 305 of the second photodiode 312. In yet other examples, a single photodiode may be implemented in the detector module 300 that extends entirely across both the first side 306 and the second side 308 of the detector module 300. However, use of a single photodiode may break a modularity of a plurality of tiles of the detector module. A scintillator, as shown in FIG. 9, may be positioned on top of the photodiodes but is omitted from FIGS. 3-5 and 7-8 for brevity.

Furthermore, it will be appreciated that the detector module 300 is a non-limiting example. Other examples of the detector module may include variations in a number of photodiodes included in the detector module. For example, more than two photodiodes may be aligned along the x-axis and various quantities of photodiodes may be arranged in parallel with the first and second photodiodes 310, 312 of FIG. 3, aligned along the z-axis, without departing from a scope of the present disclosure.

The scintillator may convert x-rays to light upon irradiation by x-ray photons in a downwards direction along the y-axis, as indicated by arrows 314. The first and second photodiodes 310, 312 may receive the light from the scintillator and convert the light to electrical current. The current may be collected from the first photodiode 310 by a first application specific integrated circuit (ASIC) 316 and from the second photodiode 312 by a second ASIC 318. The first ASIC 316 is electronically coupled to the first photodiode 310 and the second ASIC 318 is electronically coupled to the second photodiode 312. A first flex cable 320 may be attached to the first ASIC 316 and a second flex cable 322 may be attached to the second ASIC 318.

The first ASIC 316 may be positioned in a first recess 340 disposed in a first side surface 342 of the first tile 306. The first side surface 342 may be a side of the first side 306 facing the slit 324 of the detector module 300, e.g., a first slit-facing surface 342. The first side 306 may also have a second side surface 341, opposite of the first side surface 342 which may be a first outward-facing surface 341, distal to the slit 324 and to the second side 308 of the detector module 300.

The second ASIC 318 may be similarly located in a second recess 344 disposed in a first side surface 346 of the second side 308 of the detector module 300. The first side surface 346 of the second side 308 may be a side surface distal to the slit 324 and distal to the first side 306 of the detector module 300, e.g., a second outward-facing surface 346. The second side 308 of the detector module 300 also has a second side surface 343 that faces the slit 324, e.g., a second slit-facing surface 343.

Positioning the first ASIC 316 within the first recess 340 allows the entire first ASIC 316 to be maintained and tucked under the first photodiode 310, with respect to the y-axis, and relative to incoming x-ray photons. The positioning of the second ASIC 318 within the second recess 344 allows the second ASIC 318 to be tucked under the second photodiode 312, with respect to the y-axis and relative to incoming x-ray photons. As such, the first and second ASICs 316, 318 do not impede positioning the first photodiode 310 directly next to the second photodiode 312, and in some instances in contact with the second photodiode 312 so that the photodiodes of a detector array may arranged as closely spaced to one another as possible. Furthermore, tucking the ASICs under the photodiodes may allow the ASICs to be at least partially shielded from x-ray irradiation.

The first and second flex cables 320, 322 may be flexible flat cables adapted with, for example, a plastic film base bonded to flat solid conductors along one surface of the film base. A thickness of the flex cables may be very thin, e.g., paper-thin, and incorporation of the flex cables directly coupled to the first and second photodiodes 310, 312 allows bulky electrical connectors to be located at a circuit board, as shown in FIGS. 5 and 7-9, positioned below the upper portion 302 of the detector module 300 rather than at the photodiodes.

The first and second flex cables 320, 322 may transmit electrical current to the circuit board, each flex cable extending along a right side of each of the first half 306 and the second half 308 of the detector module 300. The first and second flex cables 320, 322 may extend linearly between the first and second ASICs 316, 318 and the circuit board, e.g., the flex cables do not wrap or spiral around outer surfaces of the detector module 300. The first flex cable 320 may be located in the slit 324, where the slit 324 is disposed in a central region of the detector module 300, between a first conductive block 330 and a second conductive block 332, the first and second conductive blocks 330, 332 positioned directly below the first and second photodiodes 310, 312, respectively. The slit 324 continues between a first base block 334 and a second base block 336, positioned directly below the first and second conductive blocks 330, 332, respectively. The slit 324 may extend through at least a portion of a height 326 of the upper portion 302 of the detector module 300, from a bottom of the first and second photodiodes 310, 312 to a bottom end 328 of the top portion 302 of the detector module.

The slit 324 may divide the detector module 300 into a first portion 307 and a second portion 309. The first and second portions may be a first tile 307 and a second tile 309, respectively, where the first tile 307 is formed from the first conductive block 330 and the first base block 334 and the second tile 309 is formed from the second conductive block 332 and the second base block 336. The first tile 307 is separated from the second tile 309 by a width, e.g., along the x-axis, of the slit 324. The slit 324 may extend substantially along the y-axis between the first tile 307 and the second tile 309 where an alignment of the slit 324 may deviate from the y-axis by up to 15 degrees, in one example. In another example, the alignment of the slit 324 may deviate from the y-axis by up to 45 degrees.

The slit 324 may be machined into the detector module 300 during fabrication to form a space between the first conductive block 330 and the second conductive block 332. The first and second conductive blocks 330, 332 may be formed of a conductive metal, such as aluminum, allowing conduction of heat from the first and second ASICS 316, 318 to at least one heat sink located below the upper portion 302 of the detector module 300.

The first and second conductive blocks 330, 332, may have alignment pins 304 protruding downwards, along the y-axis, from bottom surfaces of the conductive blocks. The alignment pins 304 may be inserted into corresponding apertures in top surfaces of a first base block 334 and a second base block 336, the first base block arranged under the first conductive block 330 and the second base block 336 arranged under the second conductive block 332. The first and second base blocks 334, 336 may also be formed from a conductive material, such as a metal, and may be configured as heatsinks.

By adapting the detector module 300 with the slit 324 extending through the central region of the detector module 300, the ASICs and flex cables, e.g., the first and second ASICs 316, 318, and the first and second flex cables 320, 322, may be consistently positioned at a same side, e.g., a right side, of each half of the detector module 300, as viewed from the perspective shown in FIG. 3. In conventional systems, the first ASIC 316 and the first flex cable 320 may instead be located along an outer surface of the first half 306 of the detector module 300, e.g., along a left side of the first half 306, as illustrated in FIG. 3 by dashed lines. When positioned along the left side of the first half 306 of the detector module 300, the detector module 300 may be heated by ASICs along outer surfaces of the detector module 300, resulting in formation of a cold zone at an inner, central region of the detector module, as indicated by dashed circle 338.

However, the slit 324 allows a spacing of the ASICS to be more uniform across a detector array 400, as shown in FIG. 4. The detector array 400 includes three of the detector module 300 but may include various numbers of the detector module 300 in other examples. Each detector module 300 has the first ASIC 316 and the first flex cable 320 located at the right side of the first tile 307 of the detector module 300 and the second ASIC 318 and the second flex cable 322 located at the right side of the second tile 309 of the detector module 300. The first flex cable 320 is fed through the slit 324, extending linearly along the y-axis. As such, at least a portion of the flex cables of the detector array 400 may each be positioned within the slit 324 of one detector module 300. The slit 324 separates the first tile 307 from the second tile 309 in each detector module 300. As such, a distance 402 between each of the ASICS, e.g., along the x-axis, is similar.

The positioning of the ASICs results in formation of hot zones at the ASICs, as indicated by dashed circles 404. The hot zones are also uniformly spaced apart along the x-axis. Heat generated at the ASICs may be conducted through the half of the detector module 300 to which the ASIC is coupled as well as to a half of the detector module 300 adjacent to the ASIC, e.g., the half of the detector module 300 immediately to the right of the ASIC. Heat conduction through the detector modules 300 is indicated by arrows 406.

Each detector module may be similarly heated by the ASICs due to uniform spacing, e.g., distribution, of the ASICs. By maintaining each detector module 300 at a uniform temperature, the photodiodes, e.g., the first photodiode 310 and the second photodiode 312, may be subjected to uniform heating across the detector array. The photodiodes may be temperature-sensitive components with heat-dependent performance. By maintaining even heating of the detector array, the performance of the photodiodes may be more consistent and reliable.

Additional aspects and modifications to a detector module may further enhance uniform heat distribution. For example, as shown in FIG. 5, an additional heat sink may be included in a lower portion of a second example of a detector module 500. The detector module 500 includes an upper portion 502 and a lower portion 504. The upper portion 502 may be similar to the upper portion 302 of the first example of the detector module 300 shown in FIG. 3, including a first tile 506 with a first photodiode 520 arranged above, with respect to the y-axis, the first tile 506 and a second tile 508 with a second photodiode 528 arranged above the second tile 508.

The first tile 506 may be aligned with second tile 508 along the x-axis and the first photodiode 520 may be aligned with the second photodiode 528 along the x-axis. The lower portion 504 is located below the upper portion 502, with respect to the y-axis, and may include fins 510 disposed along one side of the lower portion 504 and a circuit board 512 arranged at an opposite side of the lower portion 504 from the fins 510.

A slit 514, similar to the slit(s) 324 of FIGS. 3 and 4, extends between the first tile 506 and the second tile 508, along the y-axis, of the upper portion 502. A first ASIC 516 and a first flex cable 518 are coupled to the first tile 506 at a right side of the first tile 506, along a first conductive block 522 of the first tile 506. The second tile 508 is similarly disposed with a second ASIC 524 and a second flex cable 526 at a right side of the second tile 508, located along a second conductive block 530.

An upper end 532, with respect to the y-axis, of the lower portion 504 of the detector module 500 may be attached to a bottom end 534 of the upper portion 502 of the detector module 500. The fins 510 are arranged in parallel, extending along the x-axis, along one side of the lower portion 504 of the detector module 500 and forming a comb-like structure when viewed along the y-x plane. The fins may provide a high surface area structure that maximizes cooling of the lower portion 504 via, for example, air cooling. The fins 510 may be divided amongst a first section 536 and a second section 538. The first section 536 is positioned above the second section 538 and edges 540 of the fins 510 of the first section 536 may align with edges 542 of the fins 510 of the second section 538 along the y-axis.

The first section 536 may be formed of a material that allows the first section 536 to be a heatsink. For example, the first section 536 may be formed of aluminum, copper, other conductive metals, or conductive filled polymer materials (e.g., filled with silver, gold, nickel, carbon, etc.). Furthermore, the first section 536 may be a separate structure from the second section 538 and configured to be removable to allow access to electrical connectors coupled to the circuit board 512. The first section 536 may, for example, be bolted in place to secure the first section 536 to the bottom end 534 of the upper portion 502 of the detector module 500 and to a top 544 of the second section 538. Unbolting and removing the first section 536 may allow access to a recess 546 in the lower portion 504 of the detector module 500.

The recess 546 may be fluidly coupled to the slit 514. In other words the slit 514 may open into the recess 546 at a bottom end, relative to the y-axis, so that air in the slit 514 may mix with air in the recess 546. By configuring the slit 514 to be continuous with the recess 546, the first flex cable 518 may be fed through the slit 514 and into the recess 546. The first flex cable 518 may extend between the first ASIC 516 and a first electrical connector 548 coupled to a first side 550 of the circuit board 512. Furthermore, incorporation of the recess 546 allows a single circuit board, e.g., the circuit board 512, configured to receive electrical connectors at both sides of the circuit board, to be used to electrically communicate with more than one photodiode. Thus, a number of circuit boards included in a detector array may be reduced.

The second flex cable 526 may extend between the second ASIC 524 and the second electrical connector 552. The second electrical connector 552 may be coupled to a second side 554 of the circuit board 512, opposite of the first side 550. The first and second electrical connectors 548, 552, may be similarly configured to enable attachment of the first and second flex cables 518, 526 to the circuit board 512 to provide electrical communication between the first and second ASICs 516, 524 and the circuit board 512.

A presence of the slit 514 between the first tile 506 and the second tile 508 allows the first flex cable 518 to be positioned along a side of the first tile 506, e.g., on the right side in FIG. 5, that shortens a length of the first flex cable 518 compared to instances where the first flex cable 518 is positioned along an opposite side, e.g., on the left side, of the first tile 506. The slit 514 provides a more direct route for electrical signal transmission from the first photodiode 520 to the circuit board 512, thereby reducing loss of signal and enhancing an overall performance of the detector module 500.

The removable first section 536 provides access to the first side 550 of the circuit board so that electrical connectors, such as the first electrical connector 548 may be coupled, decoupled, and/or replaced as desired. Additionally, by configuring the first section 536 as a heat sink, heat generated by the first and second ASICs 516, 524 may be drawn away from the photodiodes, through the first and second conductive blocks 522, 530, through a base block 556, and into the first section 536 of the lower portion 504 of the detector module 500, further assisting in maintaining the photodiodes at a uniform temperature.

It will noted that while the base block 556 is shown as two separate units in FIGS. 3-5 (e.g., the first base block 334 and the second base block 336 of FIG. 3), the two units may be included in a single overall base block structure so that the two units of the base block are actually part of a single continuous base block, as shown in FIGS. 6-8. In other words, the first tile 506 and the second tile 508 may merge at the base block 556. Additionally, the lower portion 504 of the detector module 500 may also be continuous with the base block 556 of FIG. 5. The two units of the base block, as shown in FIGS. 3-5, and the lower portion of the detector module are illustrated as separate structures in FIG. 5 due to depiction of the detector module as cross-sections.

A detector module may be further adapted with an optional thermal bridge incorporated in a base block of the detector module to equalize temperatures between tiles of the detector module. An example of a base block 602 is shown in FIG. 6 from a perspective view 600, depicted without photodiodes, conductive blocks, or a removable heat sink (e.g., the first section 536 of the lower portion 504 of FIG. 5) for brevity. The base block may be formed of a metal, such as aluminum, and may include lower portions of each detector module (e.g., the lower portion 504 of FIG. 5) supported by the base block. Hereafter, reference to the base block 602 includes continuous coupling of the lower portion of each detector module to the base block 602, as shown in FIG. 6.

The base block 602 includes a portion of a slit 604, similar to the slit 324 of FIGS. 3 and 4 and the slit 514 of FIG. 5. A thermal bridge 606 may extend across the slit 604, along the x-axis, between opposite side walls of the slit 604. The thermal bridge 606 may be continuous with the side walls of the slit 604 and formed of a same material as the base block 602. In some examples, the base block 602 may be fabricated with the thermal bridge 606, e.g., molded or cast, so that the entire base block 602, including the thermal bridge 606 is a single, continuous structure. As such, the thermal bridge 606 may be integrated into the base block 602.

The thermal bridge 606 may allow conduction of heat through the base block 602 across the slit 604 so that differential heating between detector modules supported by the base block 602 may be equalized. For example, two photodiodes (and two conductive blocks arranged under the photodiodes) of a detector module may be arranged side-by-side along the x-axis within a depression 610 of the base block 602. The depression 610 may be disposed in an upper surface of the base block 602, configured as a region where a height 608 of the base block 602 is reduced. Along the z-axis, two detector modules, each detector module having one photodiode (with corresponding conductive blocks), may be seated in the depression 610. In other examples, more or less than two detector modules may be seated in the depression 610.

For example, a first cross-section 700 of the base block 602 is shown in FIG. 7. The first cross-section 700 may be taken along line A-A' shown in FIG. 6. The base block 602 supports first tiles 701 of both a first detector module 702 and a second detector module 704, the detector modules positioned adjacent to one another along the z-axis within the depression 610 of the base block 602. Each detector module has a first photodiode 706 and a first conductive block 708 located under the first photodiode 706 and a scintillator 710 layered above the first photodiode 706 of both the first and second detector modules 702, 704. In some examples, the scintillator 710 may be a continuous layer entirely covering all photodiodes of both detector modules.

A length 712 of the first photodiode 706, defined along the z-axis, may be greater than a width 714 of the first photodiode 706, defined along the x-axis. ASICs and flex cables may be attached to outer sides of the first and second detector modules 702, 704 along the y-z plane (not shown). The first cross-section 700 shows ASICS 716 and flex cables 718, which may be coupled to the first photodiode 706 of the first and second detector modules 702, 704. The flex cables 718 may extend through a slit 724 and couple to a circuit board 720 at electrical connectors 722. It will be noted that the ASICS 716 couple to an opposite site of the detector modules and the flex cables 718 extend along an opposite of the detector modules than shown in FIGS. 3-5 and 9-10. However, the different positioning of the ASICS 716 and the flex cables 718 does not alter transmission of electrical signals provided by the ASICS 716 and the flex cables 718.

The first cross-section 700 provides a cut-away view of the thermal bridge 606. The thermal bridge 606 may have a rectangular cross-section, along the y-z plane, and may be positioned between the flex cables 718, below the ASICs 716. The thermal bridge 606 is also shown in FIG. 8 in a second cross-section 800 of the base block 602. Similar to the first cross-section 700, the second cross-section 800 also includes other components of the detector modules as well as a removable cover that may be a heatsink, similar to the first section 536 of the lower portion 504 of the detector module 500 of FIG. 5.

The second cross-section 800 may be taken along line B-B' shown in FIG. 6. The second photodiode 802 of a second tile 804 of the first detector module 702 may be stacked on top of a second conductive block 806, the second conductive block 806 separated from the first conductive block 708 by the slit 724. The thermal bridge 606 is indicated by a dashed circle and is shown to be continuous with the base block 602. In other words the thermal bridge 606 is a part of the base block 602 and is not attached to the base block 602 by any seams or joints.

The thermal bridge 606 provides a path for heat flow between the first and second tiles 701, 804. As such, any thermal gradient generated between the tiles may be efficiently removed by heat conduction from a hotter side to a cooler side across the thermal bridge 606. A positioning of the thermal bridge 606 in a central region of the slit 724, with respect to the z-axis, enables heat transfer and equalization between each tile of the detector modules and between the adjacent detector modules.

Other optional aspects of a detector module may be incorporated to increase an accessibility, ease of manufacturing, and heating control of the detector module. As one example, the detector module may be configured with a two-piece frame to enable fasteners of the detector module to be readily accessed. A third example of a detector module 900 is shown in FIG. 9, which may be a two-piece detector module 900. The two-piece detector module 900 may have an upper portion 902 and a lower portion 904 which may be detached from one another.

When the upper portion 902 is detached and separated from the lower portion 904, fasteners 906 attaching components of each tile 901 of the two-piece detector module 900 may be accessible at a bottom end 908 of the upper portion 902. The fasteners 906 may extend along the y-axis through a base block 910 and a conductive block 912 of each tile 901, thus coupling the conductive block 912 to the base block 910. Above the conductive block 912, with respect to the y-axis, a photodiode 914 may be arranged at a top of each tile 901, coupled to the conductive block 912 by, for example, an adhesive.

The upper portion 902 may be removably coupled to the lower portion 904 by fastening devices, such as bolts, clips, clamps, etc. The two-piece detector module 900 may be configured with a removable cover, similar to the first section 536 of the lower portion 504 of the detector module 500 of FIG. 5. Prior to releasing the upper portion 902 of the two-piece detector module 900 from the lower portion 904, the removable cover of the lower portion 904 may be removed to allow the a first electrical connector 916, coupled to an end of a first flex cable 918, to be detached from a first side 920 of a circuit board 922. Similarly, a second electrical connector 924, coupled to an end of a second flex cable 926, may be detached from a second side 928 of the circuit board 922.

The upper portion 902 may then be separated from the lower portion 904 as indicated by arrows 930. As the upper portion 902 is pulled away from the lower portion 904, access to heads of the fasteners 906 is provided. By manufacturing the detector module 900 in a two-piece configuration, maintenance and/or replacement of components may be more easily conducted.

In another example, a detector module may be adapted to have a minimal number of thermal interfaces to configure the detector module for efficient manufacturing. A fourth example of a detector module 1000 is shown in FIG. 10. The detector module 1000 includes a first tile 1002 and a second tile 1004, the tiles included in an upper portion 1001 of the detector module 1000 and separated by a slit 1006 extending along the y-axis and along a center line 1008 of the detector module 1000.

A circuit board 1010 is positioned below the first and second tiles 1002, 1004 and along one side of a lower portion 1003 of the detector module 1000. At least a portion of the lower portion 1003 of the detector module 1000 may be biased to one side, e.g., to the left in FIG. 10, of the center line 1008 so that the circuit board 1010 is aligned with the center line 1008. A first side 1012 of the circuit board, parallel with the center line 1008, may be in face-sharing contact with the lower portion 1003 of the detector module 1000. A first flex cable 1014, coupled to a first ASIC 1016, may be connected via a first electrical connector 1018 to a second side 1020 of the circuit board 1010, the second side 1020 opposite of the first side 1012.

Similarly, a second flex cable 1022, coupled to a second ASIC 1024, may be connected via a second electrical connector 1026 to the second side 1020 of the circuit board 1010. Unlike the detector module examples shown in FIGS. 3-5 and 7-9, both flex cables are coupled to a same side of the circuit board 1010 in FIG. 10. By shifting the circuit board 1010 to align with the center line 1008, the circuit board 1010 is positioned closer to the first ASIC 1016 than the previous examples of the detector module and a length of the first flex cable 1014 is maintained relatively short. Furthermore, coupling both of the flex circuits to the same side of the circuit board 1010 results in formation of one thermal interface versus generation of two thermal interfaces when the flex circuits are coupled to opposite sides of the circuit board 1010. Fewer thermal interfaces may allow better thermal management of the detector module. Additionally, a manufacturing of the detector module with the circuit board configured to couple to flex cables only along one side of the detector module may simplify the manufacturing process, thus reducing costs and increasing throughput.

In this way, heat generation in an x-ray detector may be moderated. Detector modules of the detector may be configured with a slit extending through a central region of the detector modules, allowing ASICs of the detector modules to be spaced apart evenly throughout the detector. Uniform spacing of the ASICs encourages even heat distribution, mitigating formation of hot and cold zones and regulating heating of thermally-sensitive photodiodes. The detector modules may be further adapted with various optional elements to increase thermal management, accessibility, and ease of fabrication, including a removable cover that is also a heatsink, a thermal bridge in a base block of the detector modules, a two-piece configuration of the detector modules, and adjusting a positioning of a circuit board to modify coupling of electrical connectors to the circuit board. As a result, a lifetime of the detector may be increased while manufacturing costs may be reduced.

The technical effect of configuring each detector modules of the detector with the central slit is that the detector modules are subjected to more uniform heating across the detector, resulting in a more consistent and reliable performance of the detector.

FIGS. 1-10 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example. In addition, elements described as substantially aligned or parallel may be aligned with one another including an amount of deviation from full alignment. For example, an object described as substantially parallel with an axis may include any inclination relative to the axis between 0 to 15 degrees.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

In a first embodiment, an imaging system includes at least one detector module, the at least one detector module having a central slit separating a first tile from a second tile of the at least one detector module, a first integrated circuit located along a first side of the first tile, the first side of the first tile facing the central slit and proximate to the second tile, and a second integrated circuit located along a first side of the second tile, the first side of the second portion an outward-facing surface of the at least one module and distal to the first portion, and a first cable coupled to the first integrated circuit of the first tile and extending through the central slit of the at least one detector module. In a first example of the imaging system, additional detector modules arranged adjacent to the at least one detector module, each additional detector module having an identical configuration as the at least one detector module and wherein the first and second integrated circuits coupled to the at least one detector module and the additional detector modules are uniformly spaced apart. A second example of the imaging system optionally includes the first example, and further includes, wherein the first integrated circuit of the first tile is electrically coupled to a first photodiode positioned directly above the first tile and the first integrated circuit of the second tile is electrically coupled to a second photodiode of positioned directly above the second tile, and wherein the first integrated circuit of the first tile is positioned in the central slit. A third example of the imaging system optionally includes one or more of the first and second examples, and further includes, wherein the central slit extends between a first conductive block of the first tile and a second conductive block of the second tile, the first conductive block and the second conductive block arranged directly under the first and second photodiodes, respectively, and further extends through a base block positioned directly under the first and second conductive blocks and wherein the first integrated circuit located along the first side of the first tile is positioned within the central slit. A fourth example of the imaging system optionally includes one or more of the first through third examples, and further includes, wherein the second integrated circuit located along the first side of the second tile extends along a recess in a side surface of the second conductive block and wherein the first and second integrated circuits do not protrude, with respect to a vertical axis of the detector module, beyond outer edges of the first and second photodiodes, respectively, along a plane perpendicular to the vertical axis. A fifth example of the imaging system optionally includes one or more of the first through fourth examples, and further includes, wherein the first cable extending through the central slit is coupled at one end to a circuit board positioned below the base block and wherein the first cable extends between the first integrated circuit of the first tile and the circuit board. A sixth example of the imaging system optionally includes one or more of the first through fifth examples, and further includes a second cable extending between the second integrated circuit of the second tile and the circuit board and wherein the first cable and second cable couple to opposite sides of the circuit board. A seventh example of the imaging system optionally includes one or more of the first through sixth examples, and further includes, wherein the first integrated circuit of the first tile and the second integrated circuit of the second tile are located only along the first side of the first portion and the first side of the second portion and not along a second side, opposite of the first side, of the first and second tiles of the detector module.

In another embodiment, a detector module includes a first direct conversion detector positioned at an upper region of a first tile, a second direct conversion detector positioned at an upper region of a second tile, the second tile adjacent to the first tile and separated from the first tile by a slit extending through a central region of the detector module between the first and second tiles, a first integrated circuit electrically coupled to the first direct conversion detector, the first integrated circuit positioned in the slit and attached to a first cable extending through the slit, a second integrated circuit electrically coupled to the second direct conversion detector, the second integrated circuit positioned along an outer surface of the second tile and attached to a second cable, and a circuit board arranged below the first and second tiles, wherein the first and second cables are connected to the circuit board. In a first example of the detector module, the second integrated circuit and the second cable extend along an outward-facing side of the second tile distal to the first tile and the first integrated circuit and first cable extend along a slit-facing side of the first tile proximate to the second tile and wherein the first integrated circuit is spaced away from the second integrated circuit by at least a width of the second tile. A second example of the detector module optionally includes the first example, and further includes wherein the first cable extends along the slit-facing side of the first tile between the first integrated circuit and the circuit board and the second cable extends along the outward-facing side of the second tile between the second integrated circuit and the circuit board and wherein the first and second cables are flex cables. A third example of the detector module optionally includes one or more of the first and second examples, and further includes, wherein the first and second cables couple to opposite sides of the circuit board. A fourth example of the detector module optionally includes one or more of the first through third examples, and further includes, wherein the circuit board is substantially parallel with a centerline of the detector module and wherein the first cable and second cables are coupled to a same side of the circuit board. A fifth example of the detector module optionally includes one or more of the first through fourth examples, and further includes a lower portion of the detector module positioned below the first and second tiles and wherein the lower portion includes a removable cover configured to be a heat sink to absorb heat generated by the first and second integrated circuits. A sixth example of the detector module optionally includes one or more of the first through fifth examples, and further includes, wherein removal of the removable cover enables access to a side of the circuit board to which the first cable is coupled. A seventh example of the detector module optionally includes one or more of the first through sixth examples, and further includes, wherein the detector module is formed of two pieces configured to be detachable. A eighth example of the detector module optionally includes one or more of the first through seventh examples, and further includes a thermal bridge continuous with a base block of the detector module, the thermal bridge configured to transfer heat across the slit.

In yet another embodiment, a detector array includes a plurality of detector modules, each detector module configured with a central slit dividing a first set of one or more tiles from a second tile set of one or more tiles of the detector module, integrated circuits coupled to each of the first set of one or more tiles and each of the second set of one or more tiles, the integrated circuits evenly distributed through the detector array, and cables coupled to the integrated circuits, wherein a portion of the cables are configured to extend through the central slit of the plurality of detector modules, between the first portion and the second portion. In a first example of the detector array, half of the integrated circuits of the detector array are positioned within the central slit. A second example of the detector array optionally includes the first example, and further includes, wherein the portion of the cables extending through the central slit of the plurality of detector modules extend through the central slit to couple to circuit boards at a first side of the circuit boards and a portion of the cables not extending through the central slit extend along an outer surface of the plurality of detector modules to couple to the circuit boards at a second, opposite side of the circuit boards.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. An imaging system, comprising;
   at least one detector module, the at least one detector module having a central slit separating a first tile from a second tile of the at least one detector module;
   a first integrated circuit located along a first side of the first tile, the first side of the first tile facing the central slit and proximate to the second tile, and a second integrated circuit located along a first side of the second tile, the first side of the second portion an outward-facing surface of the at least one module and distal to the first portion; and
   a first cable coupled to the first integrated circuit of the first tile and extending through the central slit of the at least one detector module.

2. The imaging system of claim 1, further comprising additional detector modules arranged adjacent to the at least one detector module, each additional detector module having an identical configuration as the at least one detector module and wherein the first and second integrated circuits coupled to the at least one detector module and the additional detector modules are uniformly spaced apart.

3. The imaging system of claim 1, wherein the first integrated circuit of the first tile is electrically coupled to a first photodiode positioned directly above the first tile and the first integrated circuit of the second tile is electrically coupled to a second photodiode of positioned directly above the second tile, and wherein the first integrated circuit of the first tile is positioned in the central slit.

4. The imaging system of claim 3, wherein the central slit extends between a first conductive block of the first tile and a second conductive block of the second tile, the first conductive block and the second conductive block arranged directly under the first and second photodiodes, respectively, and further extends through a base block positioned directly under the first and second conductive blocks and wherein the first integrated circuit located along the first side of the first tile is positioned within the central slit.

5. The imaging system of claim 4, wherein the second integrated circuit located along the first side of the second tile extends along a recess in a side surface of the second conductive block and wherein the first and second integrated circuits do not protrude, with respect to a vertical axis of the detector module, beyond outer edges of the first and second photodiodes, respectively, along a plane perpendicular to the vertical axis.

6. The imaging system of claim 1, wherein the first cable extending through the central slit is coupled at one end to a circuit board positioned below the base block and wherein the first cable extends between the first integrated circuit of the first tile and the circuit board.

7. The imaging system of claim 6, further comprising a second cable extending between the second integrated circuit of the second tile and the circuit board and wherein the first cable and second cable couple to opposite sides of the circuit board.

8. The imaging system of claim 1, wherein the first integrated circuit of the first tile and the second integrated circuit of the second tile are located only along the first side of the first portion and the first side of the second portion and not along a second side, opposite of the first side, of the first and second tiles of the detector module.

9. A detector module, comprising;
   a first direct conversion detector positioned at an upper region of a first tile;
   a second direct conversion detector positioned at an upper region of a second tile, the second tile adjacent to the first tile and separated from the first tile by a slit extending through a central region of the detector module between the first and second tiles;
   a first integrated circuit electrically coupled to the first direct conversion detector, the first integrated circuit positioned in the slit and attached to a first cable extending through the slit;
   a second integrated circuit electrically coupled to the second direct conversion detector, the second integrated circuit positioned along an outer surface of the second tile and attached to a second cable; and a circuit board arranged below the first and second tiles, wherein the first and second cables are connected to the circuit board.

10. The detector module of claim 9, wherein the second integrated circuit and the second cable extend along an outward-facing side of the second tile distal to the first tile and the first integrated circuit and first cable extend along a slit-facing side of the first tile proximate to the second tile and wherein the first integrated circuit is spaced away from the second integrated circuit by at least a width of the second tile.

11. The detector module of claim 9, wherein the first cable extends along the slit-facing side of the first tile between the first integrated circuit and the circuit board and the second cable extends along the outward-facing side of the second tile between the second integrated circuit and the circuit board and wherein the first and second cables are flex cables.

12. The detector module of claim 9, wherein the first and second cables couple to opposite sides of the circuit board.

13. The detector module of claim 9, wherein the circuit board is substantially parallel with a centerline of the detector module and wherein the first cable and second cables are coupled to a same side of the circuit board.

14. The detector module of claim 9, further comprising a lower portion of the detector module positioned below the first and second tiles and wherein the lower portion includes a removable cover configured to be a heat sink to absorb heat generated by the first and second integrated circuits.

15. The detector module of claim 14, wherein removal of the removable cover enables access to a side of the circuit board to which the first cable is coupled.

16. The detector module of claim 9, wherein the detector module is formed of two pieces configured to be detachable.

17. The detector module of claim 9, further comprising a thermal bridge continuous with a base block of the detector module, the thermal bridge configured to transfer heat across the slit.

18. A detector array, comprising;
a plurality of detector modules, each detector module configured with a central slit dividing a first set of one or more tiles from a second tile set of one or more tiles of the detector module;
integrated circuits coupled to each of the first set of one or more tiles and each of the second set of one or more tiles, the integrated circuits evenly distributed through the detector array; and
cables coupled to the integrated circuits, wherein a portion of the cables are configured to extend through the central slit of the plurality of detector modules, between the first portion and the second portion.

19. The detector array of claim 18, wherein half of the integrated circuits of the detector array are positioned within the central slit.

20. The detector array of claim 18, wherein the portion of the cables extending through the central slit of the plurality of detector modules extend through the central slit to couple to circuit boards at a first side of the circuit boards and a portion of the cables not extending through the central slit extend along an outer surface of the plurality of detector modules to couple to the circuit boards at a second, opposite side of the circuit boards.

* * * * *